United States Patent
Mishina et al.

(10) Patent No.: US 7,253,421 B2
(45) Date of Patent: Aug. 7, 2007

(54) RADIATION IMAGE CONVERSION PANEL AND MANUFACTURING METHOD THEREOF

(75) Inventors: Noriyuki Mishina, Ome (JP);
Takafumi Yanagita, Hachioji (JP);
Akihiro Maezawa, Hino (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 249 days.

(21) Appl. No.: 10/999,689

(22) Filed: Nov. 30, 2004

(65) Prior Publication Data

US 2005/0121622 A1    Jun. 9, 2005

(30) Foreign Application Priority Data

Dec. 5, 2003    (JP)    ............................. 2003-407338

(51) Int. Cl.
*B05D 5/00*    (2006.01)

(52) U.S. Cl. .................... 250/484.4; 427/65; 427/69; 427/72

(58) Field of Classification Search ............ 250/484.4, 250/484.2, 370.11; 427/72, 69, 65
See application file for complete search history.

(56) References Cited

U.S. PATENT DOCUMENTS

| | | | | |
|---|---|---|---|---|
| 4,947,046 | A | * | 8/1990 | Kawabata et al. ........ 250/484.4 |
| 5,693,254 | A | * | 12/1997 | Sieber et al. ........ 252/301.4 H |
| 5,786,600 | A | * | 7/1998 | Lambert et al. ......... 250/484.4 |
| 6,396,066 | B1 | * | 5/2002 | Chen et al. .............. 250/488.1 |
| 6,452,203 | B1 | * | 9/2002 | Struye et al. ............... 250/581 |
| 6,864,491 | B2 | * | 3/2005 | Honda et al. ............ 250/484.4 |
| 6,870,167 | B2 | * | 3/2005 | Iwabuchi et al. ........ 250/484.4 |
| 6,921,909 | B2 | * | 7/2005 | Nagarkar et al. ........ 250/483.1 |
| 6,967,339 | B2 | * | 11/2005 | Leblans et al. .......... 250/484.4 |
| 7,091,501 | B2 | * | 8/2006 | Joly et al. ................. 250/484.4 |
| 2002/0186869 | A1 | * | 12/2002 | Neriishi ...................... 382/129 |
| 2006/0145104 | A1 | * | 7/2006 | Rogers et al. .............. 250/588 |
| 2006/0219942 | A1 | * | 10/2006 | Takasu .................... 250/484.4 |

\* cited by examiner

*Primary Examiner*—Constantine Hannaher
(74) *Attorney, Agent, or Firm*—Lucas & Mercanti, LLP

(57) ABSTRACT

A radiation image storage panel which is provided with a stimulable phosphor substance layer containing a stimulable phosphor substance formed by a gas phase accumulation method on a support, wherein said stimulable phosphor substance layer is constituted of a columnar crystal structure, and slopes $D_1$ and $D_2$ satisfy $0° \leq |D_1 - D_2| \leq 40°$, when acute angles formed by said radiation image storage panel surface and axial lines passing through the center of said columnar crystals, with respect to columnar crystals at arbitrary two points in the radiation image storage panel plane, are designated as slopes of columnar crystals, $D_1$ and $D_2$.

2 Claims, 1 Drawing Sheet

RADIATION IMAGE CONVERSION PANEL AND MANUFACTURING METHOD THEREOF

FIELD OF THE INVENTION

The present invention relates to a radiation image storage panel provided with a stimulable phosphor substance layer, which contains a stimulable phosphor substance formed by a gas phase method, on a support, and a manufacturing method of a radiation image storage panel.

BACKGROUND OF THE INVENTION

Heretofore, a so-called radiation method which applies a silver salt to obtain a radiation image has been utilized, while a method to convert a radiation image into a visual image without using a silver salt has been developed. That is, developed has been a method in which radiation, which passed through a photographic object, is absorbed by a stimulable phosphor substance, thereafter this stimulable phosphor substance is excited with a certain type of energy to make radiation energy accumulated in this stimulable phosphor substance be emitted as fluorescent light, which is detected to be made into an visual image.

As a specific method, for example, as described in U.S. Pat. No. 3,859,527, known is a radiation image storage method in which a panel provided with a stimulable phosphor substance layer is utilized and either one of or both of visual rays and infrared rays are employed as excitation energy.

In recent years, as a radiation image storage method utilizing a stimulable phosphor substance provided with high luminance, high sensitivity and high sharpness, proposed has been a radiation image storage panel utilizing a stimulable phosphor substance comprising an alkali halogenide such as CsBr as a mother material being activated by Eu. It is said that improvement of an efficiency of an X-ray conversion ratio, which has been conventionally impossible, becomes possible.

Further, a radiation image storage panel having a higher sharpness has been required in analysis of diagnostic images, and as a means to improve sharpness, for example, an attempt to improve sensitivity and sharpness by controlling a configuration of a stimulable phosphor substance itself, has been made.

As one of these attempts, for example, as described in JP-A No. 2-58000 (hereinafter, JP-A refers to Japanese Patent Publication Open to Public Inspection), proposed has been a radiation image conversion panel which is provided with a stimulable phosphor substance layer comprising slender columnar crystals having a certain slope against the normal direction of a support.

SUMMARY OF THE INVENTION

However, in a stimulable phosphor substance layer provided with columnar crystals described in above JP-A No. 2-58000, sharpness as an image capability depends on a slope of columnar crystals and determines a sharpness distribution in a radiation image storage panel plane, while a slope distribution of the columnar crystal in the plane was not defined resulting in non-uniform sharpness in the plane to cause a problem of significantly damaging of diagnostic capability.

This invention has been made in view of the above situation, and an object of the present invention is to provide a radiation image storage panel, having an excellent sharpness distribution in the plane, and a manufacturing method thereof.

The above object of the present invention can be attained by the followings.

1. A radiation image storage panel provided with a stimulable phosphor substance layer containing a stimulable phosphor substance formed by a gas phase accumulation method on a support, wherein the stimulable phosphor substance layer is constituted of a columnar crystal structure and slopes $D_1$ and $D_2$ satisfy $0° \leq |D_1 - D_2| \leq 40°$, when the acute angles formed by the surface of said stimulable phosphor substance layer and axial lines passing through the center of the columnar crystals with respect to columnar crystals at arbitrary two points in the radiation image storage panel plane are $D_1$ and $D_2$.

According to 1, since slopes $D_1$ and $D_2$ of columnar crystals at arbitrary two points in a radiation image storage panel plane satisfy $0° \leq |D_1 - D_2| \leq 40°$, a slope distribution of columnar crystals become uniform in the radiation image storage panel plane, resulting in a uniform sharpness distribution in the plane.

Herein, to prescribe slopes $D_1$ and $D_2$ of columnar crystals to satisfy $0° \leq |D_1 - D_2| \leq 40°$, is because that a slope distribution of columnar crystals may vary in the case of $40° \leq |D_1 - D_2|$, resulting in a non-uniform sharpness distribution in the plane.

2. The radiation image storage panel described in 1, wherein the stimulable phosphor substance layer contains a stimulable phosphor substance comprising an alkali halide represented by the following general formula (1) as a mother material.

General Formula (1)

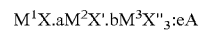

wherein $M^1$ represents at least one type of an alkali metal selected from a group comprising Li, Na, K, Rb and Cs; $M^2$ represents at least one type of an alkali metal selected from Li, Na, K, Rb and Cs, other than $M^1$; $M^3$ represents at least one type of a tri-valent metal selected from a group comprising Y, La, Ce, Pr, Nd, Pm, Sm, Eu, Gd, Tb, Dy, Ho, Er, Tm, Yb and Lu; X, X' and X" represent at least one type of a halogen selected from a group comprising F, Cl, Br and I; A represents at least one type of a rare earth element selected from a group comprising Eu, Tb, In, Ce, Tm, Dy, Pr, Ho, Nd, Yb, Er, Gd, Lu, Sm and Y; and a, b and e each represent values in ranges of $0 \leq a < 0.5$, $0 \leq b < 0.5$, and $0 < e \leq 0.2$, respectively.

According to 2, since a stimulable phosphor substance layer is comprised of a alkali halogenide represented by above general formula (1), a stimulable phosphor substance layer satisfying both of high sensitivity and high sharpness can be prepared, resulting in significant improvement of image quality of a radiation image.

3. A manufacturing method of the radiation image storage panel described in 1, wherein the evaporation source is arranged so that all the acute angles $\theta_1$, which are formed between the direction of the support plane and the axial lines connecting arbitrary points in a unit evaporation region on a support and the center of an evaporation source, satisfy $50° \leq \theta_1 \leq 90°$, and a stimulable phosphor substance was evaporated from this evaporation source onto the aforesaid support resulting in formation of a stimulable phosphor substance layer.

According to 3, since a stimulable phosphor substance layer is formed by arranging an evaporation source so that all the acute angles $\theta_1$, formed by the plane direction of a support and the axial directions, which connect arbitrary points in a unit evaporation region on a support and the center of an evaporation source, satisfy $50° \leq \theta_1 \leq 90°$, a slope distribution of columnar crystals which constitute a stimulable phosphor substance layer becomes uniform in a radiation image storage panel, which results in a uniform sharpness distribution in the plane. Therefore, image characteristics can be significantly improved.

DETAILED DESCRIPTION OF THE INVENTION

In the following, a radiation image storage panel and a manufacturing method thereof according to this invention is described in detail.

Figure 1:
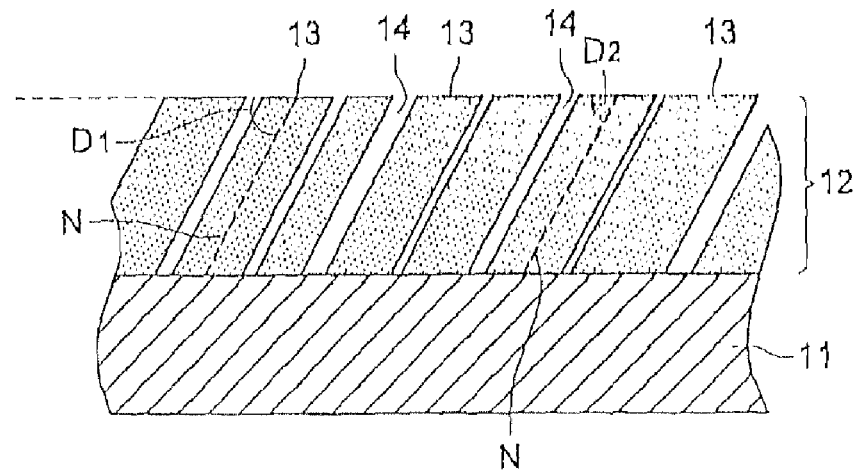
FIG. 1 is a schematic cross-sectional drawing to show an example of a stimulable phosphor substance layer formed on a support.

A radiation image storage panel of this invention is provided with support 11 and stimulable phosphor substance layer 12 which as formed on said support 11 and contains a stimulable phosphor substance, as shown in FIG. 1. Further, a protective layer (not shown in the drawing) is appropriately provided to protect stimulable phosphor substance layer 12. Herein, in stimulable phosphor substance layer 12, gaps 14 are formed between columnar crystals 13 of a stimulable phosphor substance.

And, the inventors of this invention have found that it is possible to make a sharpness distribution in the plane uniform and significantly improve image quality of a radiation image, by constituting stimulable phosphor substance layer 12 of a columnar crystal structure as well as defining slopes $D_1$ and $D_2$ of columnar crystals at arbitrary two points in a radiation image storage panel plane to satisfy $0° \leq |D_1 - D_2| \leq 40°$.

The reason to define slopes $D_1$ and $D_2$ of columnar crystals into the above range is that the slope distribution shows variation resulting in a non-uniform sharpness distribution in the plane in the case of $40° < |D_1 - D_2|$.

Herein, acute angles formed between the surface of stimulable phosphor substance layer 12 and axial lines passing through the center of columnar crystals 13 are defined as slopes $D_1$ and $D_2$ of columnar crystals 13.

Further, as for measurement of slopes of columnar crystals, each cross-section of the stimulable phosphor substance layer with respect to arbitrary two points in a radiation image storage panel plane is observed through an electronmicroscope (SEM) to determine the slopes.

A support utilized in this invention can be selected from commonly known materials as conventional radiation image storage panels, however, is preferably a quartz glass sheet, a metal sheet comprising such as aluminum, iron, tin and chromium or a carbon fiber reinforced sheet, in the case of a support for a phosphor layer being formed by a gas phase deposition.

Further, a support is preferably provided with a resin layer to make the surface to be a smooth plane.

A resin layer preferably contains a compound such as polyimide, polyethylene terephtalate, paraffin and graphite, and the thickness is preferably approximately 5-50 μm. The resin layer may be provided either on the front surface or the back surface, or on the both of them.

Further, a means to provide a resin layer on a support includes such as a lamination method and a coating method. A lamination method is performed by use of heating and pressing rollers, and the conditions are preferably heating at approximately 80-150° C., pressing at $4.90 \times 10 - 2.94 \times 10^2$ N/cm and a transport rate of 0.1-20 m/sec.

A thickness of a stimulable phosphor substance layer varies depending on the purposes of application of a radiation image storage panel and types of a stimulable phosphor substance, however, is 50-2000 μm, preferably 50-1000 μm and more preferably 100-800 μm, with respect to obtaining the effects of this invention.

Further, a stimulable phosphor substance layer includes a stimulable phosphor substance comprising an alkali halogenide represented by following general formula (1) as a mother material.

General formula (1)

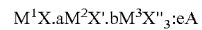

$$M^1X.aM^2X'.bM^3X''_3:eA$$

wherein, $M^1$ represents at least one type of an alkali metal selected from a group comprising Li, Na, K, Rb and Cs; $M^2$ represents at least one type of an alkali metal selected from a group comprising Li, Na, K, Rb and Cs other than $M^1$; $M^3$ represents at least one type of an tri-valent metal selected from a group comprising Y, La, Ce, Pr, Nd, Pm, Sm, Eu, Gd, Tb, Dy, Ho, Er, Tm, Yb and Lu; X, X' and X'' each represent at least one type of a halogen selected from a group comprising F, Cl, Br and I; A represents at least one type of a rare earth element selected from a group comprising Eu, Tb, In, Ce, Tm, Dy, Pr, Ho, Nd, Yb, Er, Gd, Lu, Sm and Y, and a, b and e each represent values in ranges of $0 \leq a < 0.5$, $0 \leq b < 0.5$, and $0 < e \leq 0.2$, respectively.

In the stimulable phosphor substance represented by general formula (1) described above, $M^1$ represents at least one type of an alkali metal selected from a group comprising each atom of Li, Na, K, Rb and Cs, among them preferably at least one type of an alkali earth metal atom selected from each atom of Rb and Cs and more preferably a Cs atom.

$M^2$ represents at least one type of an alkali metal atom selected from a group comprising Li, Na, K, Rb and Cs other than $M^1$, among them preferably at least one type of an alkali earth metal atom selected from each atom of Na, K and Rb.

$M^3$ represents at least one type of an tri-valent metal selected from a group comprising Y, La, Ce, Pr, Nd, Pm, Sm, Eu, Gd, Tb, Dy, Ho, Er, Tm, Yb and Lu, among them preferably utilized is a tri-valent metal atom selected from each atom of Y, Ce, Sm, Eu, La, Gd and Lu.

A represents at least one type of a rare earth element selected from Eu, Tb, In, Ce, Tm, Dy, Pr, Ho, Nd, Yb, Er, Gd, Lu, Sm and Y, among them preferable is a Eu atom.

X, X' and X'' each represent at least one type of a halogen atom selected from a group comprising each atom of F, Cl, Br and I, preferably a halogen atom selected from each atom of F, Cl and Br and more preferably a Br atom, with respect to improving stimulated emission luminance of a stimulable phosphor substance.

Further, in general formula (1), b value satisfies $0 \leq b < 0.5$ and preferably $0 \leq b < 10^{-2}$.

Stimulable phosphor substances represented by general formula (1) are manufactured by a method described below.

As raw materials of a phosphor substance:

(a) Utilized is at least one type or not less than two types of compounds selected from NaF, NaCl, NaBr, NaI, KF, KCl, KBr, KI, RbF, RbCl, RbBr, RbI, CsF, CsCl, CsBr and CsI.

(b) Utilized is at least one type or not less than two types of compounds selected from $MgF_2$, $MgCl_2$, $MgBr_2$, $MgI_2$, $CaF_2$, $CaCl_2$, $CaBr_2$, $CaI_2$, $SrF_2$, $SrCl_2$, $SrBr_2$, $SrI_2$, $BaF_2$, $BaCl_2$, $BaBr_2$, $2H_2O$, $BaI_2$, $ZnF_2$, $ZnCl_2$, $ZnBr_2$, $ZnI_2$, $CdF_2$, $CdCl_2$, $CdBr_2$, $CdI_2$, $CuF_2$, $CuCl_2$, $CuBr_2$, $CuI_2$, $NiF_2$, $NiCl_2$, $NiBr_2$ and $NiI_2$.

(c) Utilized is a compound provided with a metal atom selected from each atom of Eu, Tb, In, Cs, Ce, Tm, Dy, Pr, Ho, Nd, Yb, Er, Gd, Lu, Sm, Y, Tl, Na, Ag, Cu and Mg in general formula (1) described above.

phosphor substance raw materials of aforesaid (a)-(c) are weighed to make a mixing composition having the aforesaid value range, and dissolved in pure water.

At this time, they may be sufficiently mixed by utilizing such as a mortar, a ball mill or a mixer mill.

Next, after pH value C of the obtained aqueous solution is adjusted to 0<C<7 by addition of a predetermined acid, water is evaporated.

Then, the obtained raw material mixture is charged in a heat-resistant vessel such as a quartz crucible or an alumina crucible to be burned in an electric oven. The burning temperature is preferably 500-1000° C. The burning time varies depending on the charging amount of raw materials and the burning temperature, however, is preferably 0.5-6 hours.

The burning atmosphere is preferably a weakly reducing atmosphere such as a nitrogen gas atmosphere including a small amount of a hydrogen gas and carbon dioxide gas atmosphere including a small amount of carbon monoxide, a neutral atmosphere such as a nitrogen atmosphere and an argon gas atmosphere, or a weakly oxidizing atmosphere including a small amount of oxygen gas.

Herein, after once having been burned under the burning conditions described above, the burned product is taken out of an electric oven to be ground. Thereafter, the burned product powder may be filled in a heat-resistant vessel and charged into an electric oven to be burned again under the same burning conditions described above, which enables further enhancement of emission luminance of a stimulable phosphor substance. Further, at the time of cooling the burned product from a burning temperature to room temperature, a desired stimulable phosphor substance can be obtained by taking the burned product out of an electric oven to be cooled while being left in the air, however, it may be cooled while being kept in a weakly reducing atmosphere or in a neutral atmosphere which is the same condition as during burning.

Further, it is preferable to rapidly cool the burned product in a weakly reducing atmosphere, a neutral atmosphere or a weakly oxidizing atmosphere by transferring from a heating section to a cooling section inside an electric oven, because further enhancement of emission luminance at stimulation of the obtained stimulable phosphor substance is possible.

Further, a stimulable phosphor substance layer of this invention is formed by a gas phase accumulation method.

As a gas phase accumulation method of a stimulable phosphor substance, utilized can be an evaporation method, a sputtering method, a CVD method, an ion plating method and others, however, specifically preferable in this invention is an evaporation method.

In the following, an evaporation method preferable in this invention will be explained. Herein, since a stimulable phosphor substance is evaporated on a support by use of evaporation equipment of FIG. 2, the explanation will be made together with an explanation of evaporation equipment.

Figure 2:
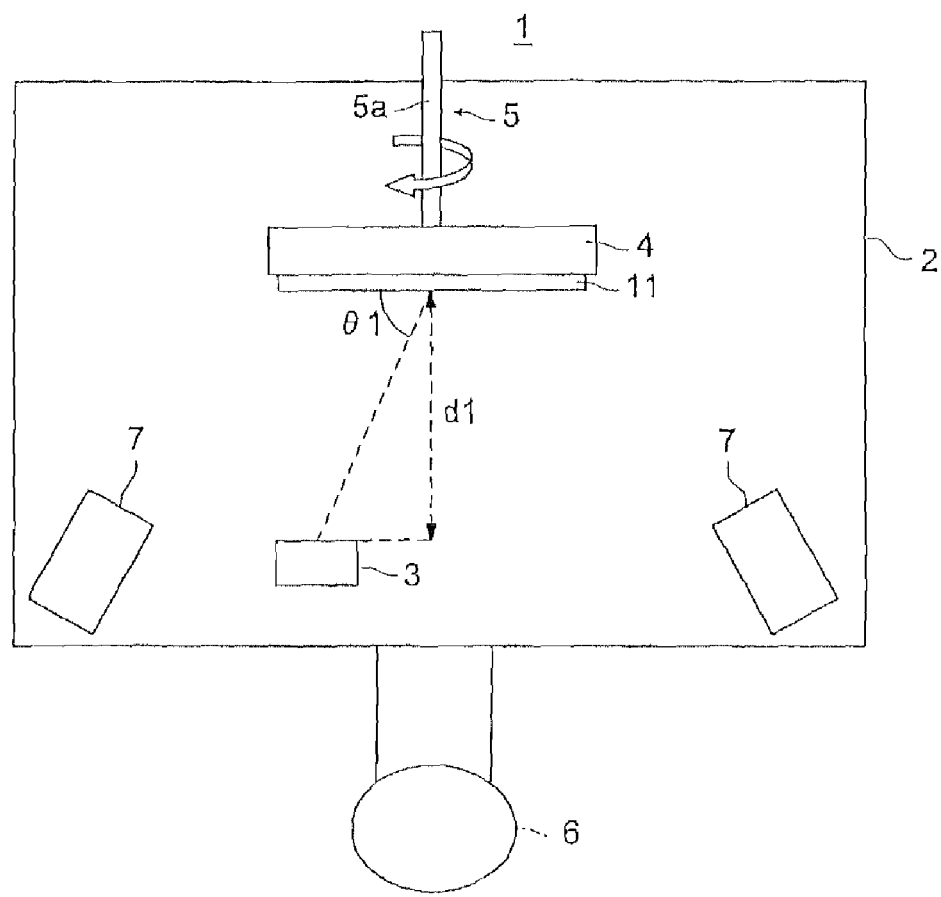
FIG. 2 is a cross-sectional drawing to show evaporation equipment based on a rotational method.

As shown in FIG. 2, evaporation equipment 1 is equipped with vacuum chamber 2, evaporation source 3 which is installed in said vacuum chamber 2 and evaporates a vapor on support 11, support holder 4 which holds support 11, support rotating mechanism 5 which rotates said support holder 4 against evaporation source 3 and evaporates a vapor from said evaporation source 3, and vacuum pump 6 which performs evacuation and introduction of the atmosphere inside vacuum chamber 2.

Evaporation source 3 may be constituted of an alumina crucible wounded with a heater to contain and heat a stimulable phosphor substance by means of a resistance heating method, of a boat, or of a heater comprising a high melting point metal. Further, a method to heat a stimulable phosphor substance may be one by means of electron beam or high frequency induction other than a resistance heating method, however, in this invention, preferable is a resistance heating method with respect to a relatively simple constitution and easy handling, being low-priced as well as applicability to great many substances. Further, evaporation source 3 may be a molecular beam source by means of a molecular source epitaxial method.

This evaporation source 3 is preferably arranged in vacuum chamber 2 so as to make an acute angle $\theta_1$, formed by the plane direction of support 11 and the axial line which connects an arbitrary point in a unit evaporation region on support 11 and the center of an evaporation source 3, satisfy $50° \leq \theta_1 \leq 90°$.

The reason to define the acute angle $\theta_1$ to be $50° \leq \theta_1 < 90°$ is because $|D_1 - D_2|$ determined by slopes $D_1$ and $D_2$ of columnar crystals 12 in a stimulable phosphor substance layer formed on support 11 becomes out of the above range in the case of evaporation at $50° > \theta_1$ or $90° > \theta_1$, which results in difficulty of making a uniform sharpness distribution.

Support rotation mechanism 5 is constituted of such as rotation axis 5a which supports support holder 4 as well as rotates support holder 4 and a motor (not shown in the drawing) which is arranged outside vacuum chamber 2 and works as a driving source of rotation axis 5a.

Further, support surface temperature controlling heater 7 which heats support 11 is installed in vacuum chamber 2. By heating support 11, absorbed substances on the surface of support 11 can be released and eliminated, generation of an impurity layer between support 11 and a stimulable phosphor substance can be prevented, and enhancement of adhesion and adjustment of layer properties of a stimulable phosphor substance layer can be performed.

Further, a shutter (not shown in the drawing), which shut the space being spread from evaporation source to support 11, may be equipped between support 11 and evaporation source 3. The shutter can prevent substances other than the object substances, which are adhered on the surface of a stimulable phosphor substance, from evaporating and being adhered on support 11 at the initial stage of evaporation.

To form a stimulable phosphor substance layer on support 11 by employing thus constituted evaporation equipment 1, first, evaporation source 3 is arranged in vacuum chamber 2 so as to make an acute angle $\theta_1$ satisfy a desired acute angle $\theta_1$ within $50° \leq \theta_1 \leq 90°$, and support 11 is attached to support holder 4.

Next, the inside of vacuum chamber 2 is evacuated. Then, support holder 4 is rotated against evaporation source 3 by support rotation mechanism 5, and a stimulable phosphor substance is evaporated from heated evaporation source 3 when vacuum chamber 2 reaches a vacuum degree at which evaporation is possible, to grow the stimulable phosphor substance on the surface of support 11 up to a desired thickness. In this case, distance d1 between support 11 and evaporation source 3 is preferably arranged at 100-1500 mm.

Herein, a stimulable phosphor substance utilized as an evaporation source is preferably finished into a tablet form by means of pressure compression.

Further, in stead of a stimulable phosphor substance, a raw material thereof or a raw material mixture thereof is possible to be utilized.

Further, in this case stimulable phosphor layer 12 without containing a binder is formed as shown in FIG. 1, however, fillers such as a binder may be filled in gap 14 formed between columnar crystals 13, which reinforces stimulable phosphor substance layer 12, in addition to this a high light absorptive substance or a high light reflective substance also may be filled. This can provide a reinforcement effect, as well as is effective to reduce a lateral light diffusion of exciting light for stimulation being incident into stimulable phosphor substance layer 12.

Further, in the aforesaid evaporation process, a stimulable phosphor substance layer can be also formed by dividing into plural times. In addition to this, it is also possible to form a stimulable phosphor layer simultaneously with synthesizing a stimulable phosphor substance on a support.

Further, in an evaporation method, an object to be evaporated (a support, a protective layer or an intermediate layer) may be appropriately cooled or heated at the time of evaporation.

In addition to this, after finishing evaporation, a stimulable phosphor layer may be heat processed. Further, in an evaporation method, a reactive evaporation may be performed by appropriately introducing a gas such as $O_2$ and $H_2$.

At forming a stimulable phosphor substance layer by the above gas phase accumulation method, a temperature of forming a stimulable phosphor layer is preferably set at room temperature (rt)-300° C. and more preferably at 50-200° C.

In such a manner described above, a radiation image storage panel of this invention is manufactured by appropriately providing a protective layer on the opposite side to the support of a stimulable phosphor substance layer after forming a stimulable phosphor substance layer provided with a layer comprising a columnar crystal structure. A protective layer may be formed by directly coating a protective layer coating solution on the surface of a stimulable phosphor substance layer, or by adhering a protective layer prepared separately in advance on a stimulable phosphor substance layer.

As materials for a protective layer, utilized are ordinary protective layer materials such as cellulose acetate, nitro cellulose, polymethylmethacrylate, polyvinyl butyral, polyvinyl formal, polycarbonate, polyester, polyethylene terephthalate, polyethylene, polyvinylidene chloride, nylon, polytetrafluoroethylene, polytrifluoro-chloroethylene, a tetrafluoroethylene-hexafluoropropyrene copolymer, vinylidene chloride-vinyl chloride copolymer and a vinylidene chloride-acrylonitrile copolymer. In addition to this, a transparent glass substrate can be also utilized as a protective layer.

Further, the protective layer may be also formed by accumulating an inorganic substance such as SiC, SiO2, SiN and $Al_2O_3$ by such as an evaporation method or a spattering method. These protective layer preferably has a layer thickness of 0.1-2000 μm.

EXAMPLES

In the following, this invention will be specifically explained referring to examples, however, embodiments of this invention is not limited thereto.

Radiation image storage panels of examples 1-3 and comparative examples 1-3 were prepared according to the following method.

Example 1

Preparation of Radiation Image Storage Panel

A stimulable phosphor substance layer having a columnar structure comprising a stimulable phosphor substance (CsBr:Eu) was formed on the one side of a support utilizing evaporation equipment 1 shown in FIG. 2.

As a support, a CFPR support having a size of 500 mm×500 mm was utilized.

First, the above phosphor substance raw material as an evaporation material was filled in a resistance heating crucible while support 11 was mounted on rotating support holder 4, and evaporation source 3 was arranged so as to make acute angle $\theta_1$, which is formed by the plane direction of support 11 and a axial line connecting the center of support 11 and the center of evaporation source 3, of 50° as well as distance d1 between support 11 and evaporation source 3 was adjusted to 420 mm.

Subsequently, after the inside of evaporation equipment 1 was once evacuated and a vacuum degree was adjusted to $1.0 \times 10^{-12}$ Pa by introducing an argon gas, a temperature of support 11 was kept at 100° C. while rotating support 11 at a rate of 10 rpm. Successively, a stimulable phosphor substance was evaporated by heating the resistance heating crucible and evaporation was finished when a thickness of a stimulable phosphor substance layer reached 400 μm.

Then, the stimulable phosphor substance layer was put into a protective bag under a dry air atmosphere, resulting in preparation of a radiation image storage panel having a structure comprising a stimulable phosphor substance being sealed.

Example 2

A radiation image storage panel was prepared in a similar manner to example 1, except that distance d1 between a support and an evaporation source was adjusted to 610 mm and acute angle $\theta_1$ to 60°.

Example 3

A radiation image storage panel was prepared in a similar manner to example 1, except that distance d1 between a support and an evaporation source was adjusted to 970 mm and acute angle $\theta_1$ to 70°.

Comparative Example 1

A radiation image storage panel was prepared in a similar manner to example 1, except that distance d1 between a support and an evaporation source was adjusted to 130 mm and acute angle $\theta_1$ to 20°.

Comparative Example 2

A radiation image storage panel was prepared in a similar manner to example 1, except that distance d1 between a support and an evaporation source was adjusted to 205 mm and acute angle $\theta_1$ to 30°.

Comparative Example 3

A radiation image storage panel was prepared in a similar manner to example 1, except that distance d1 between a support and an evaporation source was adjusted to 300 mm and acute angle $\theta_1$ to 40°.

The following evaluations were performed with respect to radiation image storage panels obtained above.

<Measurement of Slope of Columnar Crystals>

As arbitrary two points in the plane of a radiation image storage panel, the center portion and the edge portion (the circumferential edge portion) of the panel were selected, and a cross-section of a stimulable phosphor substance layer at the center portion of the panel was observed by use of an electronmicroscope (SEM) to determine slope $D_1$ of the columnar crystal. Slope $D_2$ of the columnar crystal at the edge portion of the panel was also determined in a similar manner, and $|D_1-D_2|$ was determined. The results are shown in Table 1.

<Evaluation of Sharpness Distribution>

In measurement of sharpness, after X-rays irradiation on a radiation image storage panel at a tube voltage of 80 kVp through a MTF measuring rectangular wave chart type No. 9 (manufactured by Kyokko Co., Ltd.), the radiation image storage panel was excited by scanning with a semi-conductor laser (680 nm) of 100 mW, and a stimulated emission from a stimulable phosphor substance layer was received with a photomultiplier tube (manufactured by Hamamatsu Photonics K.K.) to be converted to an electrical signal, which was analogue/digital converted and recorded on a magnetic tape. The recorded magnetic tape was analyzed by a computer to determine a modulation transfer function (MTF) value of an X-ray image recorded on a magnetic tape. The MTF was represented by a special frequency at 1 cycle (lines pair)/mm.

As for a sharpness distribution, determined were MTF in the total of 9 fractional planes when a radiation image storage panel was divided into 3 parts in the longitudinal direction and 3 parts in the lateral direction, and a sharpness distribution was determined based on obtained MTF values of 9 points according to the following equation. The result is shown in Table 1.

Sharpness distribution (%)={MTF (Max. value)–MTF (Center value)}/MTF (Center value)×100

<Visual Evaluation>

In visual evaluation, after X-rays irradiation at a tube voltage of 80 kVp by arranging a chest phantom on the whole plane of a radiation image storage panel, the radiation image storage panel was excited by scanning with a semi-conductor laser (680 nm) of 100 mW, and a stimulated emission from a stimulable phosphor substance layer was received with a photomultiplier (manufactured by Hamamatsu Photonics K.K.) to obtain digital image data. Obtained image data signals were subjected to a gradation treatment to be provided with a constant contrast, and printed on a X-ray film with a laser resulting in preparation of an output film. Obtained output films were observed by use of a viewing box in a dark room, and ranking evaluation was performed based on A and B as follows. The results are shown in Table 1.

A: With respect to visualization of an image of chest, no differences of sharpness of a structural object are observed in comparison of the center portion and the circumference portion.

B: With respect to visualization of an image of chest, some differences of sharpness of a structural object are observed in comparison of the center portion and the circumference portion.

TABLE 1

| | $|D_1-D_2|$ | $d_1$ (mm) | $\theta_1$ (angle) | Sharpness distribution (%) | Visual evaluation |
|---|---|---|---|---|---|
| Example 1 | 40 | 420 | 50 | 2.6 | A |
| Example 2 | 30 | 610 | 60 | 1.9 | A |
| Example 3 | 20 | 970 | 70 | 1.3 | A |
| Comparative example 1 | 70 | 130 | 20 | 4.6 | B |
| Comparative example 2 | 60 | 205 | 30 | 4.0 | B |
| Comparative example 3 | 50 | 300 | 40 | 3.3 | B |

It is clear from the result of Table 1 that examples 1-3, in which slopes of columnar crystals at arbitrary two points in a radiation image storage panel, $D_1$ and $D_2$, satisfy $0°\leq|D_1-D_2|\leq40°$, exhibit narrow and uniform sharpness distribution as well as an excellent result in visual evaluation resulting in improved image quality of a radiation image.

Further, in particular, it is clear from example 3 that the larger is $\theta_1$ within $50°\leq\theta_1\leq90°$, the narrower and more uniform can be made a sharpness distribution.

Therefore, by defining slopes of columnar crystals at arbitrary two points in a radiation image storage panel, $D_1$ and $D_2$, to satisfy $0°\leq|D_1-D_2|\leq40°$, a sharpness distribution can be made uniform, which results in significant improvement of image quality of a radiation image.

What is claimed is:

1. A method of manufacturing a radiation image storage panel comprising a support having thereon a stimulable phosphor substance layer, the method comprising the step of:

evaporating a stimulable phosphor substance contained in a n evaporation source so as to form the stimulable phosphor layer on the support which is rotated by a support rotation mechanism, wherein the evaporation source is arranged so that all of the acute angles $\theta_1$, which are formed between the direction of the support plane and the axial lines connecting arbitrary points in a unit evaporation region on the support and the center of the evaporation source, satisfy $50°\leq\theta_1\leq70°$;

the stimulable phosphor substance layer is constituted of a columnar crystal structure and slopes $D_1$ and $D_2$ satisfy $0°\leq|D_1-D_2|\leq40°$, when the acute angles formed by the surface of said stimulable phosphor substance layer and axial lines passing through the center of the columnar crystals taken at arbitrary two points in the radiation image storage panel plane are $D_1$ and $D_2$; and the stimulable phosphor substance can absorb radiation passed through a photographic object and thereafter emit light by irradiation with a second energy on the stimulable phosphor substance.

2. The method of manufacturing a radiation image storage panel of claim 1,
wherein the stimulable phosphor substance layer contains a stimulable phosphor substance comprising an alkali halide represented by the following general formula (1) as a mother material, General Formula (1)

$$M^1X \cdot aM^2X' \cdot bM^3X''_3 : eA$$

wherein $M^1$ represents an alkali metal selected from the group consisting of Li, Na, K, Rb and Cs; $M^2$ represents an alkali metal selected from the group consisting of Li, Na, K, Rb and Cs, other than $M^1$; $M^3$ represents a tri-valent metal selected from the group consisting of Y, La, Ce, Pr, Nd, Pm, Sm, Eu, Gd, Tb, Dy, Ho, Er, Tm, Yb and Lu; X, X' and X" represent a halogen selected from the group consisting of F, Cl, Br and I; A represents a rare earth element selected from the group consisting of Eu, Tb, In, Ce, Tm, Dy, Pr, Ho, Nd, Yb, Er, Gd, Lu, Sm and Y; and a, b and e each represent values of $0 \leq a < 0.5$, $0 \leq b < 0.5$, and $0 < e < 0.2$, respectively.

* * * * *